United States Patent
Shoki

(10) Patent No.: US 8,512,918 B2
(45) Date of Patent: Aug. 20, 2013

(54) MULTILAYER REFLECTIVE FILM COATED SUBSTRATE FOR A REFLECTIVE MASK, REFLECTIVE MASK BLANK, AND METHODS OF MANUFACTURING THE SAME

(75) Inventor: Tsutomu Shoki, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 151 days.

(21) Appl. No.: 13/259,862

(22) PCT Filed: Mar. 23, 2010

(86) PCT No.: PCT/JP2010/054923
§ 371 (c)(1),
(2), (4) Date: Sep. 23, 2011

(87) PCT Pub. No.: WO2010/110237
PCT Pub. Date: Sep. 30, 2010

(65) Prior Publication Data
US 2012/0019916 A1    Jan. 26, 2012

(30) Foreign Application Priority Data

Mar. 26, 2009 (JP) ................. 2009-077362

(51) Int. Cl.
*G03F 1/38* (2012.01)
*G03F 1/42* (2012.01)

(52) U.S. Cl.
USPC .............................. 430/5; 430/22

(58) Field of Classification Search
USPC ............ 430/5, 22, 394; 356/399, 401
See application file for complete search history.

(56) References Cited

U.S. PATENT DOCUMENTS

| | | | |
|---|---|---|---|
| 6,765,673 | B1 | 7/2004 | Higashikawa |
| 2003/0184721 | A1 | 10/2003 | Itoh |
| 2007/0077499 | A1 | 4/2007 | Ikuta et al. |

FOREIGN PATENT DOCUMENTS

| | | |
|---|---|---|
| JP | 5-158218 A | 6/1993 |
| JP | 2001-033941 A | 2/2001 |
| JP | 2003-248299 A | 9/2003 |
| JP | 2004-193269 A | 7/2004 |
| JP | 2006-195291 A | 7/2006 |
| JP | 2007-273678 A | 10/2007 |
| JP | 2008-041740 A | 2/2008 |
| WO | 2007/043488 A1 | 4/2007 |
| WO | 2008/129914 A1 | 10/2008 |

*Primary Examiner* — Stephen Rosasco
(74) *Attorney, Agent, or Firm* — Sughrue Mion, PLLC

(57) ABSTRACT

By forming on a substrate a reference point mark having a concave or convex shape with its side walls being generally upright, even if a multilayer reflective film, an absorber film, and so on are formed over the reference point mark, sufficient contrast for inspection light is obtained so that the position of the reference point mark can be identified with high accuracy.

24 Claims, 3 Drawing Sheets

MULTILAYER REFLECTIVE FILM COATED SUBSTRATE FOR A REFLECTIVE MASK, REFLECTIVE MASK BLANK, AND METHODS OF MANUFACTURING THE SAME

CROSS REFERENCE TO RELATED APPLICATIONS

This application is a National Stage of International Application No. PCT/JP2010/054923 filed Mar. 23, 2010, claiming priority based on Japanese Patent Application No. 2009-077362 filed Mar. 29, 2009, the contents of all of which are incorporated herein by reference in their entirety.

TECHNICAL FIELD

This invention relates to a multilayer reflective film coated substrate for a reflective mask, to a reflective mask blank, and to methods of manufacturing them.

BACKGROUND ART

In recent years, with higher integration of semiconductor devices, patterns finer than the transfer limit of the photolithography technique using the conventional ultraviolet light have been required in the semiconductor industry. In order to enable transfer of such fine patterns, the EUV lithography being an exposure technique using extreme ultraviolet light (hereinafter referred to as EUV light) with a shorter wavelength is expected to be promising. Herein, the EUV light represents light in a wavelength band of the soft X-ray region or the vacuum ultraviolet region and, specifically, light having a wavelength of about 0.2 nm to 100 nm.

As an exposure mask for use in this EUV lithography, use is normally made of a reflective mask in which a multilayer reflective film (multilayer film) for reflecting the EUV light serving as exposure light is formed on a substrate (base substrate) and, further, an absorber film (metal film) for absorbing the EUV light is formed in a pattern on the multilayer reflective film.

When pattern transfer is carried out using an exposure apparatus (pattern transfer apparatus) with such a reflective mask mounted therein, the exposure light incident on the reflective mask is absorbed at a portion where the absorber film pattern is present, while, is reflected by the multilayer reflective film at a portion where the absorber film pattern is not present so that the reflected light is transferred to, for example, a semiconductor substrate (resist-coated silicon wafer) through a reflective optical system.

On the other hand, with the increasing demand for miniaturization in the photolithography process, problems in the photolithography process used in the semiconductor manufacturing processes are becoming remarkable. As one of them, there is cited a problem of a defect of a photomask substrate formed with a pattern, which is used in the photolithography process.

Conventionally, the existing position of a defect of a photomask substrate is specified by the distance from an end face of the substrate. As a consequence, the positional accuracy is low and thus, when patterning a light-shielding film while avoiding the defect, it is difficult to avoid it on the order of μm. Therefore, the defect is avoided by changing the direction of pattern transfer or roughly shifting the pattern transfer position on the order of mm.

Under these circumstances, for the purpose of increasing the inspection accuracy of a defect position in a light-transmitting mask, there is an attempt to form a reference mark on a transparent substrate and to specify a position of a defect using the reference mark as a reference position (see, e.g. JP-A-2003-248299 (Patent Document 1)). In the invention described in this publication, the reference mark is formed to be very shallow (depth is about 3 μm) so as to prevent dust from staying in a recess serving as the reference mark. In the case of a normal light-transmitting mask, although a thin film such as a light-shielding film is formed on an upper surface of a reference mark, since it comprises a single layer or about several layers, even if the depth of the reference mark is shallow, it is possible to obtain contrast for inspection light (deep-ultraviolet light of about 190 to 260 nm, or the like) and thus to recognize a position of the reference mark in a defect inspection.

PRIOR ART DOCUMENT

Patent Document

Patent Document 1: JP-A-2003-248299

SUMMARY OF THE INVENTION

Problem to be Solved by the Invention

However, if this reference mark in the form of the recess having a cross-sectional shape in which the width decreases from the main surface toward the bottom of the recess is applied to a reflective mask blank, since a multilayer reflective film in the form of films laminated by several tens of cycles is stacked on an upper surface of the reference mark, the depth and width of the recess tend to decrease as compared with a normal light-shielding film of the same thickness. As a consequence, if the depth is only about 3 μm, the depth and width of the recess decrease upon laminating each layer of the multilayer reflective film so that the contrast for inspection light (deep-ultraviolet light of about 190 to 260 nm, or the like) cannot be obtained. Further, if a capping film, a buffer film, and an absorber film are formed on this multilayer reflective film, the depth of the recess further decreases. Further, if the reference mark of Patent Document 1 is formed by YAG laser irradiation, the edge roughness of a portion formed with the reference mark is large and this makes it more difficult to achieve high detection accuracy of the reference mark.

In the case of a light-transmitting mask blank, defects include a defect present in a glass substrate and a defect present in a light-shielding film. With respect to the defect of the glass substrate, it can be judged whether or not the glass substrate is usable according to the number and positions of defects in an inspection after a polishing process of the glass substrate is finished. Therefore, importance is attached to avoiding the defect of the light-shielding film. With respect to the defect of the light-shielding film, defect correction with FIB or the like can be carried out at an unavoidable portion.

On the other hand, in the case of a reflective mask blank, since EUV exposure light does not transmit a glass substrate and a defect on a surface of the glass substrate directly affects a multilayer reflective film, a defect of the multilayer reflective film particularly becomes a problem. Although a defect inspection is carried out also for the substrate after the formation of the multilayer reflective film, since defects of the multilayer reflective film are caused by many factors such as a surface defect of the substrate, the incorporation of particles in the formation of the multilayer reflective film, and so on, the defect occurrence rate is high as compared with the light-transmitting mask blank. Therefore, if the selection criterion is set too strict, the yield is largely degraded.

Accordingly, this should be dealt with by lowering the allowable defect criterion and arranging a transfer pattern so as not to expose a defective portion of the multilayer reflective film (i.e. so as to cover the defective portion with the absorber film). However, for this, it is essential to specify a planar position of the defect with high accuracy.

It is an object of this invention to provide a multilayer reflective film coated substrate in which a multilayer reflective film is formed on a glass substrate with a reference point mark given at a predetermined position, or a reflective mask blank in which an absorber film is formed on the multilayer reflective film coated substrate, wherein even if inspection light is irradiated onto an uppermost surface of the multilayer reflective film or of the absorber film formed over the reference point mark in a defect inspection, sufficient contrast is obtained between a position of the reference point mark and its peripheral portion so that the position of the reference point mark can be identified with high accuracy.

Means for Solving the Problem

Since the conventional reference point mark is configured by physically forming the concave shape, whose cross-sectional shape has a gentle curve, on the main surface of the substrate using a laser, the contrast of the edge being a boundary portion between the main surface and a side wall is difficult to obtain even on the main surface of the substrate and, thus, in the state of the mask blank in which the film is formed on the main surface, the contrast of the edge is more difficult to obtain. Therefore, a defect inspection apparatus detects the reference point mark by contrast between a portion formed with no reference point mark and a deep portion of the concave shape, on a surface of the film. However, as described before, in the case of the reflective mask blank, since it has the structure in which the multilayer reflective film, the capping film, the buffer film, the absorber film, and so on are stacked, the contrast is difficult to obtain on a surface of the absorber film only with the depth of about 3 μm. Further, since the edge roughness of the reference mark is large, highly accurate mark detection is difficult to achieve.

Therefore, in order to achieve the above-mentioned object, the present inventor has considered a reference point mark that can obtain sufficient contrast by forming, on a surface of a substrate, a mark pattern having a concave or convex shape with its side wall being generally upright, thereby obtaining contrast at an edge portion of the reference point mark. The present inventor has found that, in the case of such a groove-like reference point mark, sufficient contrast is obtained by setting the depth in the case of the concave shape or the height in the case of the convex shape to greater than 30 nm.

Specifically, according to this invention, there is provided a multilayer reflective film coated substrate for a reflective mask, comprising a substrate and a multilayer reflective film on a main surface of the substrate, the multilayer reflective film having a structure in which high refractive index layers composed mainly of a high refractive index material and low refractive index layers composed mainly of a low refractive index material are alternately laminated, wherein a reference point mark is formed in an area outside a pattern forming area on the main surface, on a side where the multilayer reflective film is formed, of the substrate, and the reference point mark has a concave or convex shape with a side wall being substantially upright. Further, the multilayer reflective film is formed on the main surface including a portion where the reference point mark is formed. With this configuration, there is a merit of requiring no change from conventional with respect to a process of forming the multilayer reflective film.

Reversely, the multilayer reflective film may be formed on the main surface except at least a portion where the reference point mark is formed. With this configuration, when an electron beam is used for scanning the reference point mark, it is possible to suppress the exertion of influence due to thermal damage or the like.

In the above-mentioned multilayer reflective film coated substrate for the reflective mask, the reference point mark may have a depth that is detectable by scanning with an electron beam. In the case of scanning with the electron beam, as compared with scanning with inspection light used in a conventional defect inspection, the reference point mark can be detected even with a smaller height difference between the reference point mark and its peripheral portion. Further, since the width of the scanning electron beam is small, the position detection with higher accuracy is enabled.

In the above-mentioned multilayer reflective film coated substrate for the reflective mask, since the reference point mark has the concave or convex shape with its side wall being generally upright, the contrast at its edge portion is liable to be obtained so that even if the depth of the concave shape or the height of the convex shape is only greater than 30 nm, it sufficiently functions as the reference point mark. When more reliable detection is required in the case of scanning with an electron beam, the depth of the concave shape or the height of the convex shape is preferably set to 40 nm or more. Further, when more reliable detection is required also in the case of scanning with inspection light used in a conventional defect inspection, it is preferably set to greater than 50 nm.

The aforementioned multilayer reflective film coated substrate for the reflective mask may comprise a mark-formation thin film between the substrate and the multilayer reflective film, and the reference point mark may have the concave shape formed in the mark-formation thin film or the concave shape formed through the mark-formation thin film into the substrate. In this case, a resist pattern having a concave pattern is formed on the mark-formation thin film and, by dry etching using the resist pattern as a mask, the concave shape is formed in the mark-formation thin film or, continuously, the substrate is further dry-etched to form the concave shape through the mark-formation thin film into the substrate, thereby obtaining the reference point mark. With this configuration, it is not necessary to strip the mark-formation thin film after the formation of the reference point mark.

The mark-formation thin film may be formed of a material having a resistance against an etching gas for use in etching the substrate. In this case, a resist pattern having a concave pattern is formed on the mark-formation thin film and, by dry etching using the resist pattern as a mask, the concave shape is formed in the mark-formation thin film or, further, using as a mask an etching mask pattern which is the mark-formation thin film with the transferred concave pattern, the substrate is dry-etched to form the concave shape through the mark-formation thin film into the substrate, thereby obtaining the reference point mark. Also with this configuration, it is not necessary to strip the mark-formation thin film after the formation of the reference point mark. Further, the thickness of the resist pattern can be reduced.

If the mark-formation thin film is made of a conductive material, the following effect is also exhibited. In the case where a capping film, a buffer film, an absorber film, and so on are formed on this multilayer reflective film coated substrate to thereby manufacture a reflective mask blank and a reflective mask is manufactured based on it, when EUV exposure light continues to be irradiated onto the reflective mask, the multilayer reflective film is gradually electrified. In this event, if the mark-formation thin film is made of the conductive material, electrons can escape through the mark-formation thin film. Particularly in the case where the reflective mask is of the type using the phase shift effect and has a structure in which the multilayer reflective film in a blind area is removed, this is more effective because electrons trapped in the multilayer reflective film in an area surrounded by the blind area can escape through the mark-formation thin film.

In the case of the reference point mark of the convex shape, the reference point mark may be formed of a material different from a material forming the substrate. In this case, a mark-formation thin film made of a material etchable by an etching gas that hardly etches the substrate is formed on the main surface of the substrate, then a resist pattern having a convex pattern is formed on the mark-formation thin film, and, by dry etching using the resist pattern as a mask, the convex shape is formed by the mark-formation thin film, thereby obtaining the reference point mark. With this configuration, it is possible to reliably suppress degradation of the surface roughness or flatness of the substrate main surface other than a portion where the convex shape is formed. In this case, since a glass-based material is often used as the substrate, the material of the mark-formation thin film is preferably a material that can be etched by a chlorine-based gas being an etching gas that hardly etches the glass-based material, or by a mixed gas of chlorine-based gas and oxygen. As the material etchable by the chlorine-based gas, there can be cited a tantalum-based material (e.g. Ta, TaB, TaC, TaN, TaBN, TaCN, TaBCN, or the like) substantially free of oxygen or a tantalum-based alloy material (TaHf, TaZr, or the like). As the material etchable by the mixed gas of chlorine-based gas and oxygen, there can be cited a chromium-based material (e.g. Cr, CrN, CrC, CrO, CrON, CrCN, CrOC, CrOCN, or the like), a ruthenium-based material, or the like.

In the above-mentioned multilayer reflective film coated substrate for the reflective mask, it is preferable that the position where the reference point mark is formed be located outside a pattern forming area of the reflective mask and, further, be located inside by a predetermined width from an outer edge of the substrate. The reference point mark preferably has a cross shape as seen from the main surface side of the substrate. It is further preferable that the number of reference point marks be three or more and that the three or more reference point marks be formed at positions that are not aligned in a straight line.

Further, according to this invention, there is provided a method of manufacturing a multilayer reflective film coated substrate for a reflective mask, the multilayer reflective film coated substrate comprising a substrate and, on a main surface of the substrate, a multilayer reflective film having a structure in which high refractive index layers composed mainly of a high refractive index material and low refractive index layers composed mainly of a low refractive index material are alternately laminated, the method comprising the steps of forming a resist pattern having a reference point mark pattern on the main surface of the substrate, and dry-etching the substrate using the resist pattern as a mask, thereby forming a reference point mark having a concave or convex shape with a side wall being substantially upright. In this case, there is no possibility of degradation of the surface roughness or flatness of the substrate main surface and thus it is also possible to suppress an increase in the number of defects due to the formation of the reference point mark.

Further, according to this invention, there is provided a method of manufacturing a multilayer reflective film coated substrate for a reflective mask, the multilayer reflective film coated substrate comprising a substrate and, on a main surface of the substrate, a multilayer reflective film having a structure in which high refractive index layers composed mainly of a high refractive index material and low refractive index layers composed mainly of a low refractive index material are alternately laminated, the method comprising the steps of forming a mark-formation thin film on the main surface of the substrate, forming a resist pattern having a reference point mark pattern on an upper surface of the mark-formation thin film, and dry-etching the mark-formation thin film using the resist pattern as a mask, thereby forming a reference point mark having a concave or convex shape with a side wall being substantially upright.

In this case, since the reference point mark is formed in the mark-formation thin film, there is a merit that it is not necessary to carry out a step of dry-etching the substrate and a step of stripping the mark-formation thin film. Further, the thickness of the resist pattern can be reduced. In particular, in the case of forming the reference point mark of the convex shape, it is possible to suppress degradation of the flatness or surface roughness of the substrate.

According to this invention, there is provided a method of manufacturing a multilayer reflective film coated substrate for a reflective mask, the multilayer reflective film coated substrate comprising a substrate and, on a main surface of the substrate, a multilayer reflective film having a structure in which high refractive index layers composed mainly of a high refractive index material and low refractive index layers composed mainly of a low refractive index material are alternately laminated, the method comprising the steps of forming, on the main surface of the substrate, a mark-formation thin film having a resistance against an etching gas for etching the substrate, forming a resist pattern having a reference point mark pattern on an upper surface of the mark-formation thin film, dry-etching the mark-formation thin film using the resist pattern as a mask, thereby forming an etching mask pattern, and dry-etching the substrate using the etching mask pattern as a mask, thereby forming a reference point mark having a concave or convex shape with a side wall being substantially upright.

In this case, since the reference point mark is formed by the concave shape formed in the mark-formation thin film and the substrate, it is possible to make the thickness of the mark-formation thin film thinner and thus to make the film stress smaller.

The above-mentioned method of manufacturing the multilayer reflective film coated substrate for the reflective mask may comprise a step of stripping the mark-formation thin film after forming the reference point mark on the substrate. The multilayer reflective film may be formed on the main surface except at least a portion where the reference point mark is formed. The mark-formation thin film is preferably formed of a material composed mainly of Cr. As the material composed mainly of Cr, there can be cited, for example, Cr, CrN, CrC, CrO, CrON, CrCN, CrOC, CrOCN, or the like. The chromium-based material is a material that can be etched by a mixed gas of chlorine-based gas and oxygen and has very high etching resistance against a fluorine-based gas. The substrate of a glass-based material is easily etched by the fluorine-based gas and has high etching resistance against the mixed gas of chlorine-based gas and oxygen. Therefore, the chromium-based material has very high etching selectivity with respect to the substrate of the glass-based material and thus it is possible to reliably suppress degradation of the surface roughness or flatness of the substrate main surface upon stripping the mark-formation thin film.

As another material having high etching selectivity with respect to the substrate of the glass-based material, there can be cited a tantalum-based material (e.g. Ta, TaB, TaC, TaN, TaBN, TaCN, TaBCN, or the like) substantially free of oxygen or a tantalum-based alloy material (TaHf, TaZr, or the like), which is the material etchable by a chlorine-based gas. As a material etchable by a mixed gas of chlorine-based gas and oxygen, there can be cited a ruthenium-based material or the like. When the mark-formation thin film is not stripped, in the case of the configuration where the reference mark is formed only in the mark-formation thin film using the resist pattern as a mask or in the case of the configuration where the reference mark is formed in the mark-formation thin film and the substrate using only the resist pattern as a mask, the reference mark can be formed without any problem even by using a material that can be etched by a fluorine-based gas.

A reflective mask blank according to this invention comprises an absorber film for absorbing exposure light on the multilayer reflective film of the aforementioned multilayer reflective film coated substrate for the reflective mask. A buffer film composed mainly of Cr or a capping film composed mainly of Ru may be formed between the multilayer reflective film and the absorber film.

A method of manufacturing a reflective mask blank according to this invention comprises a step of forming an absorber film for absorbing exposure light on the multilayer reflective film of the multilayer reflective film coated substrate for the reflective mask manufactured by the method of manufacturing the aforementioned multilayer reflective film coated substrate for the reflective mask. Further, the method may comprise a step of forming a buffer film composed mainly of Cr on the multilayer reflective film or a step of forming a capping film composed mainly of Ru on the multilayer reflective film, before a step of forming the absorber film.

A method of manufacturing a reflective mask according to this invention comprises a step of patterning the absorber film of the aforementioned reflective mask blank.

Effect of the Invention

According to a multilayer reflective film coated substrate of this invention, by forming on a substrate a reference point mark having a concave or convex shape with its side wall being generally upright, even if a multilayer reflective film is formed over the reference point mark, sufficient contrast upon scanning with inspection light or with an electron beam for defect inspection is obtained so that the position of the reference point mark can be identified with high accuracy. As a consequence, there is obtained the multilayer reflective film coated substrate that can specify a position of a defect with an accuracy on the order of μm using the reference point mark as a reference. Further, even in the case where a reflective mask blank is manufactured by forming an absorber film and so on an upper surface of this multilayer reflective film coated substrate, sufficient contrast can be obtained between the reference point mark and its peripheral portion even by irradiating inspection light onto the absorber film. Since the position of the defect can be specified with the accuracy on the order of μm, the defect can be accurately avoided when patterning the absorber film into a transfer pattern so that it is possible to manufacture a defect-free reflective mask.

MODE FOR CARRYING OUT THE INVENTION

Hereinbelow, embodiments of this invention will be described with reference to figures, Examples, and so on. These figures, Examples, etc. and the description are only illustrative of this invention and do not limit the scope of this invention. It is needless to say that other embodiments can also belong to the category of this invention as long as they agree with the gist of this invention.

Figure 1A:
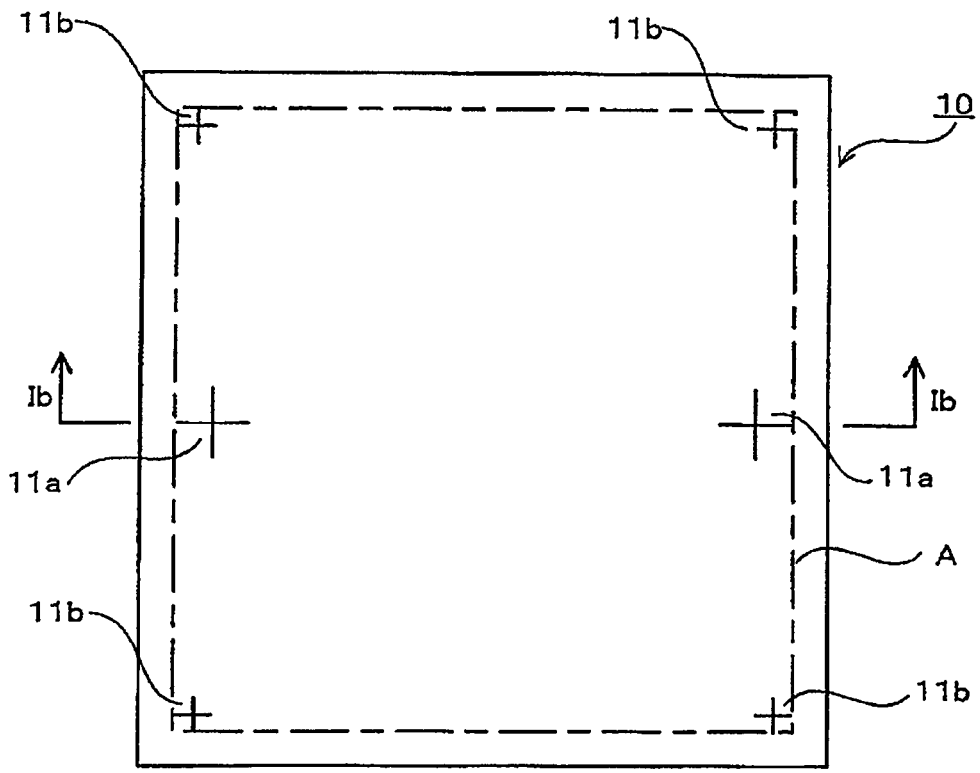
FIG. 1A is a plan view for explaining a reflective mask blank in an embodiment of this invention.
Figure 1B:
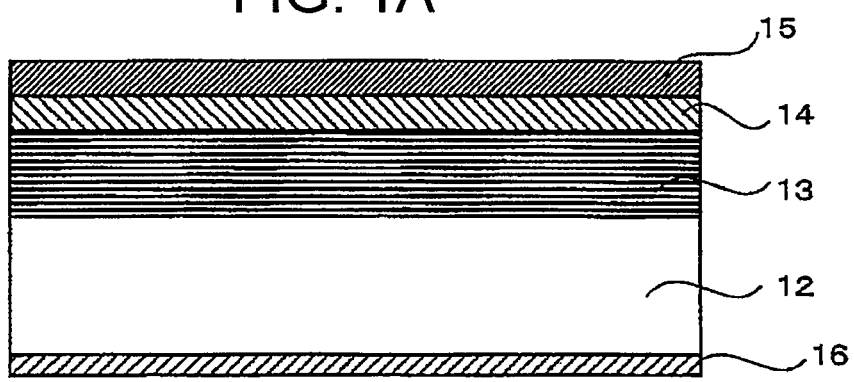
FIG. 1B is a cross-sectional view for explaining the reflective mask blank in the embodiment of this invention and is a lb-lb cross-sectional view of FIG. 1A.

Diagrams for explaining a reflective mask blank according to the embodiment of this invention are shown in FIG. 1. FIG. 1A is a plan view of the reflective mask blank and FIG. 1B is a cross-sectional view taken along lb-lb of FIG. 1A.

As shown in FIG. 1A, a reflective mask blank 10 according to the embodiment of this invention has two course-alignment reference point marks 11a of a relatively large size and reference marks 11b of a small size thereon. In the same figure, an example having two course-alignment reference marks 11a and four reference point marks 11b is shown as one example. An area for forming the reference point marks is preferably an area, where the flatness is excellent, of a substrate main surface of the reflective mask blank 10, while, in terms of the polishing characteristics in a polishing process of the substrate main surface, the flatness tends to be bad on the outer peripheral side of the substrate main surface. However, since the center side of the main surface (e.g. the inside of a 132 mm square area with respect to the substrate center) serves as a pattern forming area in the manufacture of a reflective mask, portions for providing the reference marks 11a and 11b are preferably as close to the outer peripheral side as possible. Taking them into account, the reference marks 11a and 11b are preferably disposed inside an area indicated by a chain line A in FIG. 1A, where a predetermined flatness can be ensured (e.g. in the case of a 152 mm square substrate, a 134 mm square area with respect to the substrate center), and in the vicinity of the boundary of that area. In the case where the flatness of the substrate main surface can be made better, the reference point marks 11a and 11b may be provided in an area inside a 142 mm square of the substrate main surface and, in the case where the flatness of the substrate main surface is higher, the reference point marks 11a and 11b may be provided in an area inside a 146 mm square of the substrate main surface.

The shape of the main surface, on the side where the reference point marks are formed (on the side where a multilayer reflective film is formed), of the reflective mask blank 10 is preferably such that, for example, in the case of the 152 mm square substrate, the flatness in the area inside the 142 mm square is 0.3 μm or less and the shape thereof is a convex shape which is relatively high at its central portion and relatively low at its peripheral portion.

As shown in FIG. 1B, the reflective mask blank 10 according to the embodiment of this invention has a substrate 12, a multilayer reflective film 13 formed on a main surface of the substrate 12, a buffer film 14 formed on the multilayer reflective film 13, and further an absorber film 15 formed on the buffer film 14, and has at least a conductive film 16 on the back side of the substrate 12. The multilayer reflective film 13 has a structure in which high refractive index layers composed mainly of a high refractive index material and low refractive index layers composed mainly of a low refractive index material are alternately laminated. If necessary, a capping film may be provided instead of the buffer film 14 or between the multilayer reflective film 13 and the buffer layer.

The composite in the state where the multilayer reflective film 13 is formed on the substrate 12 before the formation of the buffer film 14, the absorber film 15, and the conductive film 16 is called a multilayer reflective film coated substrate.

Figure 2A:
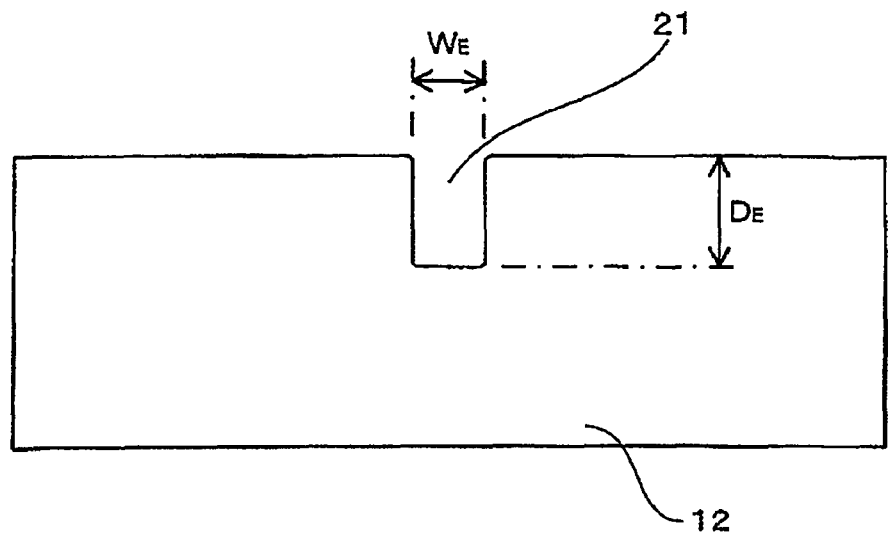
FIG. 2A is a diagram for explaining a reference point mark in the embodiment of this invention and is an enlarged view of a cross section of the reference point mark.
Figure 2B:
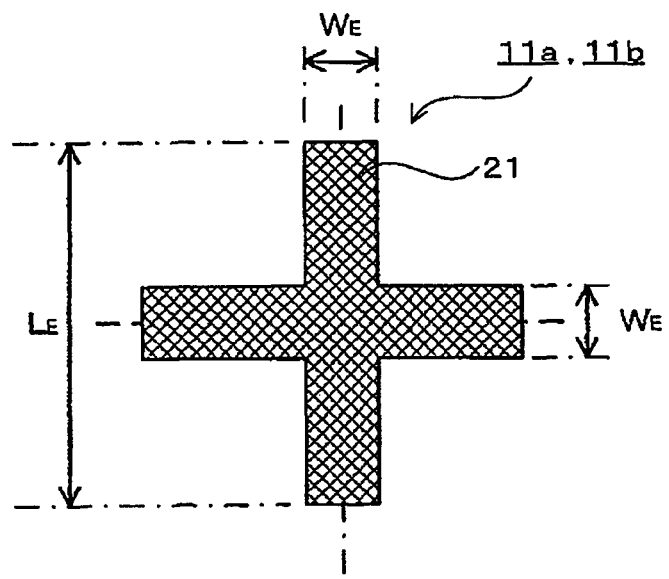
FIG. 2B is a diagram for explaining the reference point mark in the embodiment of this invention and is an enlarged view of a diagram as seen from above a main surface of a substrate (in plan view).

Next, using FIG. 2, the shape of the reference point mark 11b will be described. FIG. 2A is an enlarged view of a cross section of the reference point mark 11b formed on the substrate 12 and FIG. 2B is an enlarged view of a diagram as seen from above the substrate main surface (in plan view). The cross section of the reference point mark 11b is a recess 21 of a groove shape with its side walls being generally upright as shown in FIG. 2B. The shape of the reference point mark 11b as seen from above the substrate main surface (in plan view) is a cross shape as shown in FIG. 2B. The size is preferably such that the width (indicated by $W_E$ in FIG. 2A) is 4 μnm or more. However, when the reference point mark 11b is scanned by an electron beam, it can be detected even with a smaller width. The depth (indicated by $D_E$ in FIG. 2A) should be set to greater than 30 nm. When more reliable detection is required in the case of scanning using an electron beam, it is preferably set to 40 nm or more. In the case of scanning with inspection light used in a conventional defect inspection, it is preferably set to greater than 50 nm. In particular, in the case of scanning the reference point mark 11b using the electron beam, when the depth of the reference point mark 11b is greater than 200 nm, the detection reproducibility tends to be lowered. The reproducibility is liable to be obtained if the depth of the reference point mark 11b is at least set to 200 nm or less and the reproducibility is further improved if the depth is set to 150 nm or less, and is good if the depth is set to less than 150 nm (e.g. 140 nm or less, 130 nm or less, or the like). The length (indicated by $L_E$ in FIG. 2B) is preferably 100 μm or more and more preferably 400 μm or more. Herein, the groove shape with its side walls being generally upright is not limited to a perpendicular direction (90° with respect to a bottom surface) and, if it is an oblique angle of about 80° to 100° with respect to the bottom surface, it sufficiently functions as the reference point mark.

When scanning the reference point mark using inspection light or an electron beam, there is a case where a resist film is not present on the absorber film 15 at the position where the reference point mark is present (including a case where no resist film is formed over the entire absorber film 15 and a case where the resist film is formed in an area other than the outer periphery including the position where the reference point mark is present), a case where the resist film is formed thereon, or a case where the resist film is formed thereon and, further, as its upper layer, a conductive coating film is formed for ensuring the conductivity in electron beam writing. In any of the cases, the reference point mark sufficiently functions if it satisfies the above-mentioned conditions.

The reference mark 11b is small in size and thus it is difficult to visually seek its position. Although there is a method of directly scanning the reference mark 11b by inspection light or an electron beam, this is not preferable because its detection takes time and because in the case where the resist film is formed over the reference point mark 11b, there is a possibility of the occurrence of a portion where the resist sensitivity changes due to the inspection light during scanning and, particularly in the case of scanning with the electron beam, there is a possibility of the occurrence of a portion where the resist is exposed to light. In view of this, it is preferable to provide the course-alignment reference mark 11a which is larger in size than the reference mark 11b. If the width $W_E$ and depth $D_E$ of the reference point mark 11a are approximately equal to or greater than those of the reference mark 11b, it is sufficiently detectable. The length $L_E$ is preferably ten times or more that of the reference mark 11a (1000 μm or more, more preferably 4000 μm or more). Although it is configured that the reference marks 11a are provided at two positions in FIG. 1A, they may be provided at three positions or four or more positions. Also with respect to the reference marks 11b, although the reference mark 11b is provided at one position at each of four corners in FIG. 1A, they may be provided at two or more positions at each corner.

Figure 3:
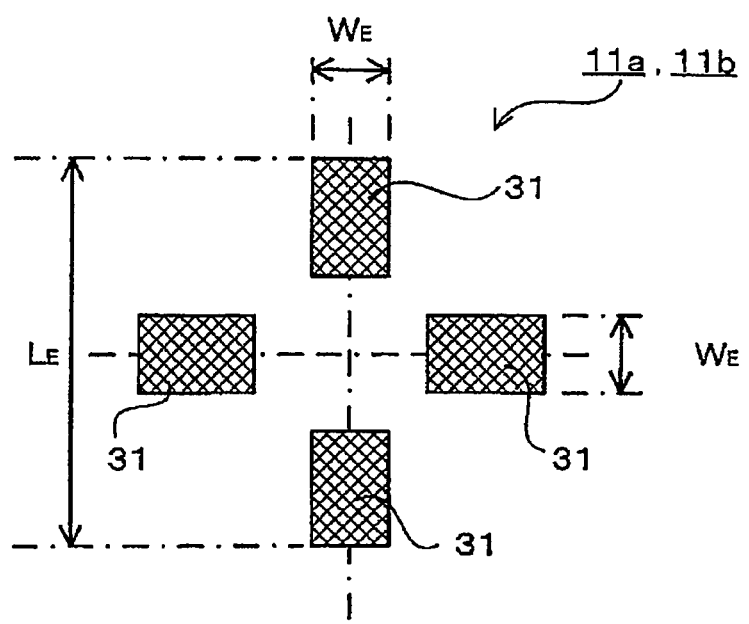
FIG. 3 is a diagram for explaining a reference point mark in an embodiment of this invention.

As the reference point mark 11a, 11b, other than the configuration of the cross shape in plan view described above, there is considered a configuration in which, as shown in FIG. 3, rectangular recesses 31 are provided at regular intervals in up-and-down and right-and-left directions with respect to the center point intended to be the center of a reference point mark and this reference point mark is used as the reference point mark 11a, 11b. The dimensions such as the width ($W_E$), depth ($D_E$), and length ($L_E$) may be the same as those of the cross shape shown in FIG. 2B.

Next, a method of forming the reference point mark 11a, 11b on the substrate 12 will be described. The reference point mark 11a, 11b can be formed by dry etching through the following processes. Herein, an example using a glass substrate is shown as one example of the substrate 12.

<Reference Point Mark Forming Processes>

(1) On the upper surface of the substrate 12, a Cr-based film (CrN, CrO, CrC, CrON, CrCN, CrOC, CrOCN, or the like can be cited, but in terms of low film stress, CrOCN is most suitable) is formed as a thin film for mark formation.

(2) A resist film for electron beam writing (FUJIFILM FEP-171 or the like) is formed on an upper surface of the Cr-based film.

(3) A pattern of the reference point mark 11 is written on the resist film by an electron beam and then development is carried out, thereby forming a pattern so that the resist film after the development remains at a portion other than the reference point mark 11.

(4) The Cr-based film is dry-etched using a mixed gas of $Cl_2$ gas and $O_2$ gas (or wet-etched using a wet etching solution such as a mixed solution of ceric ammonium sulfate and perchloric acid), thereby transferring an etching mask pattern of the reference point mark to the Cr-based film.

(5) The resist film is stripped.

(6) The glass substrate is dry-etched using a mixed gas of fluorine-based gas such as $CF_4$ gas and He gas, thereby forming the reference point mark 11 on the glass substrate. Since the Cr-based film has a resistance against this mixed gas, it functions as an etching mask.

(7) The Cr-based film is stripped by wet etching using a wet etching solution or by dry etching using a mixed gas of $Cl_2$ gas and $O_2$ gas.

Through the above-mentioned processes, the reference point mark 11 can be formed on the glass substrate.

It may happen that surface defects on the substrate main surface increase due to the stripping of the mark-formation thin film after the formation of the concave-shaped reference point mark 11. In the case where the increase of surface defects should be reliably suppressed, it is preferable that, after the formation of the reference point mark 11, a very surface layer (e.g. about 5 to 10 nm) of the substrate main surface be removed by polishing and then cleaning, which is the same as conventional one, be carried out. As the polishing in this case, there can be cited non-contact polishing using polishing abrasive particles such as colloidal silica, MRF polishing using a magnetic fluid, CMP, short-time polishing by a planetary gear motion using colloidal silica, or the like. In this case, the depth of the reference point mark 11 is preferably set to a depth obtained by adding a machining allowance for the above-mentioned polishing to an identifiable depth.

Examples 1 to 8, Comparative Example 1

Hereinbelow, as Examples 1 to 8 and Comparative Example 1, there are shown the results of manufacturing reflective mask blanks each using a glass substrate having reference point marks of the shape shown in FIGS. 2A and 2B and examining whether identification of each reference point mark is good or bad. First, a glass substrate of 6-inch square (about 152 mm×152 mm×6.35 mm) was used as a substrate and reference point marks 11a and 11b (the reference point marks 11a at two positions and the reference point marks 11b at four positions) were respectively provided at the positions shown in FIG. 1A, i.e. in an area inside a 134 mm square with respect to the center of a substrate main surface such that the outer peripheral side of each of the reference point marks 11a and 11b was in contact with the boundary of that area.

As the reference point marks, recesses were formed by the above-mentioned process using dry etching. By changing the dry etching conditions and so on, there were prepared several kinds of glass substrates with different sizes of the reference point marks 11b.

For the formation of the reference point marks 11a and 11b, first, a mark-formation thin film with low stress made of CrOCN (Cr:O:C:N=33:36:20:11 at % ratio) was formed to a thickness of 10 nm on the main surface of each substrate. Then, a chemically amplified resist for electron beam writing (FEP-171: manufactured by FUJIFILM Electronic Materials Co., Ltd.) was formed to a thickness of 300 nm as a resist film on an upper surface of the mark-formation thin film. Then, patterns of the reference point marks were written on the resist film by an electron beam and then development was carried out, thereby forming resist patterns of the reference point marks. In this event, the resist patterns of the reference point marks 11b were such that the depths $D_E$ were set to several kinds, i.e. 100 nm to 30 nm, the widths $W_E$ were set to several kinds, i.e. 4 μm to 1 μm, while the lengths $L_E$ of the cross shapes were each set to 400 μm. Since the reference point marks 11a were larger in size than the reference point marks 11b, the reference point marks 11a were not used as comparison objects so that the resist patterns thereof were fixed with a depth $D_E$ of 100 nm, a width $W_E$ of 4 μm, and a length $L_E$ of 4000 μm.

Then, using the resist patterns as a mask, the mark-formation thin film was dry-etched using a mixed gas of $Cl_2$ gas and $O_2$ gas, thereby transferring the patterns of the reference point marks to the mark-formation thin film. Further, using patterns (etching mask patterns) of the mark-formation thin film as a mask, the glass substrate was dry-etched using a mixed gas of $CF_4$ gas and He gas so that the depth $D_E$ from the main surface became 100 nm to 30 nm. Finally, the remaining etching mask film was stripped by dry etching using a mixed gas of $Cl_2$ gas and $O_2$ gas.

Through the above-mentioned processes, the reference point marks 11a and 11b were formed on the glass substrates.

Then, multilayer reflective film coated substrates were manufactured by forming a multilayer reflective film on the main surface, formed with the reference point marks 11a and 11b, (including the portions where the reference point marks are formed) of each glass substrate. In the manufacture of each multilayer reflective film coated substrate, Si layers (low refractive index layers) and Mo layers (high refractive index layers) suitable as reflective films in the range of 13 to 14 nm being a wavelength of EUV exposure light were laminated on the substrate by ion beam sputtering, thereby forming a multilayer reflective film with a total thickness of 291 nm (a Si layer was first formed to 4.2 nm, then a Mo layer was formed to 2.8 nm and, given that this formed one cycle, layers were laminated by 40 cycles, and then finally a Si film was formed to 11 nm). In the formation of each Mo layer, scattering particles from a Mo target were caused to be incident at an oblique angle of 63° with respect to a direction perpendicular to the substrate (oblique incidence film formation). In the formation of each Si layer, scattering particles from a Si target were caused to be incident in a direction perpendicular to the substrate (normal incidence film formation).

Then, reflective mask blanks were manufactured based on these multilayer reflective film coated substrates. A buffer film made of chromium nitride (CrN:N=10 at %) was formed on an upper surface of the multilayer reflective film. The film formation was carried out by a DC magnetron sputtering apparatus and the film thickness was set to 10 nm. Further thereon, an absorber film made of tantalum boron nitride (TaBN) was formed to a thickness of 50 nm. The film formation was carried out by a DC magnetron sputtering apparatus using a TaB alloy target (Ta:B=80:20 at % ratio) and using a mixed gas of xenon (Xe) gas and nitrogen gas ($N_2$) (Xe:$N_2$=12.9:6 flow rate ratio) as a sputtering gas.

Further, on the back side of the glass substrate, a conductive film made of chromium nitride (CrN:N=10 at %) was formed to a thickness of 70 nm. The film formation was carried out by a DC magnetron sputtering apparatus.

With respect to the several kinds of reflective mask blanks with the different shapes (widths $W_E$ and depths $D_E$) of the reference point marks 11b manufactured by the method described above, it was confirmed whether identification of each reference point mark was good or bad. By detection methods using a mask inspection apparatus KLA-5 Series manufactured by KLA-Tencor Corporation, which was one of hitherto-used defect inspection apparatuses with inspection light, and using an electron beam, respectively, it was confirmed whether identification of each of the reference point marks of several widths and depths was good or bad. The results thereof are shown in Table 1.

TABLE 1

|  | Reference Point Mark Width $W_E$ (μm) | Reference Point Mark Depth $D_E$ (nm) | Reference Point Mark Identification Condition by Inspection Light | Reference Point Mark Identification Condition by Electron Beam |
| --- | --- | --- | --- | --- |
| Example 1 | 4 | 100 | good | good |
| Example 2 | 4 | 60 | good | good |
| Example 3 | 4 | 50 | identification difficult | good |
| Example 4 | 4 | 40 | identification failed | good |
| Example 5 | 4 | 35 | identification failed | good |
| Comparative Example 1 | 4 | 30 | identification failed | identification difficult |
| Example 6 | 3 | 60 | good | good |
| Example 7 | 2 | 60 | good | good |
| Example 8 | 1 | 60 | good | good |

As seen from Table 1, in the case of conventional reference point mark detection using inspection light, the reference point mark 11b was recognized well when the depth $D_E$ of the reference point mark 11b was 60 nm or more (Examples 1, 2), while, the reference point mark 11b was not recognized well when the depth $D_E$ was 50 nm or less (Examples 3, 4, 5, Comparative Example 1). When the depth $D_E$ of the reference point mark 11b was 60 nm, even if the width $W_E$ was reduced from 4 μm to 1 μm (Examples 2, 6, 7, 8), the reference point marks 11b were recognized well with no difference.

On the other hand, in the case of reference point mark detection using an electron beam, the reference point mark 11b was recognized well when the depth $D_E$ of the reference point mark 11b was 35 nm or more (Examples 1, 2, 3, 4, 5), while, the reference point mark 11b was not recognized well when the depth $D_E$ was less than 35 nm (Comparative Example 1). When the depth $D_E$ of the reference point mark 11b was 60 nm, even if the width $W_E$ was reduced from 4 μm to 1 μm (Examples 2, 6, 7, 8), the reference point marks 11b were recognized well with no difference.

Examples 9 to 16, Comparative Example 2

Hereinbelow, as Examples 9 to 16 and Comparative Example 2, there are shown the results of manufacturing reflective mask blanks each using a glass substrate having reference point marks 11a and 11b of the shape shown in FIG. 2B and examining whether identification of each reference point mark is good or bad. Examples 9 to 16 and Comparative Example 2 differ from Examples 1 to 8 and Comparative Example 1 in that a multilayer reflective film is not formed at portions where the reference point marks are formed.

In the Examples herein, there were prepared several kinds of substrates by using the same substrates as in Examples 1 to 8 and Comparative Example 1 and forming reference point marks 11a and 11b with different sizes by the same method as in Examples 1 to 8 and Comparative Example 1.

Then, multilayer reflective film coated substrates were manufactured by forming a multilayer reflective film on a main surface, formed with the reference point marks, of each glass substrate by the same method as in Examples 1 to 8 and Comparative Example 1. In the Examples herein, however, the multilayer reflective film was not formed at portions where the reference point marks were formed.

Then, in the same manner as in Examples 1 to 8 and Comparative Example 1, reflective mask blanks were manufactured by forming a buffer film and an absorber film on an upper surface of each multilayer reflective film coated substrate and forming a conductive film on a main surface, on the opposite side, of each substrate. In this event, the buffer film and the absorber film were formed also at the portions where the multilayer reflective film was not formed (areas including the portions where the reference point marks were formed).

With respect to the several kinds of reflective mask blanks with the different sizes (widths $W_E$ and depths $D_E$) of the reference point marks 11b manufactured by the method described above, it was confirmed whether identification of each reference point mark was good or bad, by the same methods as in Examples 1 to 8. The results thereof are shown in Table 2.

TABLE 2

|  | Reference Point Mark Width $W_E$ (μm) | Reference Point Mark Depth $D_E$ (nm) | Reference Point Mark Identification Condition by Inspection Light | Reference Point Mark Identification Condition by Electron Beam |
| --- | --- | --- | --- | --- |
| Example 9 | 4 | 100 | good | good |
| Example 10 | 4 | 60 | good | good |
| Example 11 | 4 | 50 | identification difficult | good |
| Example 12 | 4 | 40 | identification failed | good |
| Example 13 | 4 | 35 | identification failed | good |
| Comparative Example 2 | 4 | 30 | identification failed | identification difficult |
| Example 14 | 3 | 60 | good | good |
| Example 15 | 2 | 60 | good | good |
| Example 16 | 1 | 60 | good | good |

As seen from Table 2, in the case of conventional reference point mark detection using inspection light, the reference point mark 11b was recognized well when the depth $D_E$ of the reference point mark 11b was 60 nm or more (Examples 9, 10), while, the reference point mark 11b was not recognized well when the depth $D_E$ was 50 nm or less (Examples 11, 12, 13, Comparative Example 2). When the depth $D_E$ of the reference point mark 11b was 60 nm, even if the width $W_E$ was reduced from 4 μm to 1 μm (Examples 10, 14, 15, 16), the reference point marks 11b were recognized well with no difference.

On the other hand, in the case of reference point mark detection using an electron beam, the reference point mark 11b was recognized well when the depth $D_E$ of the reference point mark 11b was 35 nm or more (Examples 9, 10, 11, 12, 13), while, the reference point mark 11b was not recognized well when the depth $D_E$ was less than 35 nm (Comparative Example 2). When the depth $D_E$ of the reference point mark 11b was 60 nm, even if the width $W_E$ was reduced from 4 μm to 1 μm (Examples 10, 14, 15, 16), the reference point marks 11b were recognized well with no difference.

From the results described above, no particular difference was observed with respect to the detection of the reference point marks 11b between the case where the multilayer reflective film was formed over the reference point marks 11b and the case where it was not formed thereover.

When a reflective mask is manufactured using a reflective mask blank according to this invention, since a reference point mark can be recognized well, the position of a defect in the reflective mask blank can be accurately specified. As a consequence, by patterning an absorber film into a transfer pattern while accurately avoiding the defect, it is possible to manufacture the reflective mask with few defects.

This invention is not limited to the above-mentioned embodiments and can be carried out with appropriate changes thereto. For example, while, in the above-mentioned embodiments, the reference point mark has the concave shape with its side walls being generally upright, this invention is not limited thereto. Even with a convex shape with its side walls being generally upright, the same effect is obtained. Further, although the buffer film made of chromium nitride was formed between the multilayer reflective film and the absorber film, a capping film composed mainly of Ru may be formed between the multilayer reflective film and the absorber film. The thickness of this capping film is preferably set in the range of about 2 nm to 5 nm.

Further, a low-reflection layer made of tantalum boron oxide (TaBO) may be formed on an upper surface of the absorber layer. The thickness of the layer is preferably set to 15 nm. The film formation can be carried out by a DC magnetron sputtering apparatus using a TaB alloy target (Ta:B=80:20 at % ratio) and using a mixed gas of argon (Ar) gas and oxygen gas ($O_2$) (Ar:$O_2$=58:32.5 flow rate ratio) as a sputtering gas.

The materials, sizes, processing sequences, and so on in the above-mentioned embodiments are only examples and this invention can be carried out by changing them in various ways within a range capable of exhibiting the effect of this invention. Other than that, this invention can be carried out with appropriate changes within a range not departing from the object of this invention.

The invention claimed is:

1. A multilayer reflective film coated substrate for a reflective mask, comprising a substrate and a multilayer reflective film on a main surface of the substrate, the multilayer reflective film having a structure in which high refractive index layers composed mainly of a high refractive index material and low refractive index layers composed mainly of a low refractive index material are alternately laminated, wherein a reference point mark is formed in an area outside a pattern forming area on the main surface, on a side where the multilayer reflective film is formed, of the substrate, and the reference point mark has a concave or convex shape with a side wall being substantially upright.

2. The multilayer reflective film coated substrate for the reflective mask according to claim 1, wherein the multilayer reflective film is formed on the main surface including a portion where the reference point mark is formed.

3. The multilayer reflective film coated substrate for the reflective mask according to claim 1, wherein the multilayer reflective film is formed on the main surface except at least a portion where the reference point mark is formed.

4. The multilayer reflective film coated substrate for the reflective mask according to claim 1, wherein the reference point mark has the concave shape with a depth capable of being detected by electron beam scanning or the convex shape with a height capable of being detected by the electron beam scanning.

5. The multilayer reflective film coated substrate for the reflective mask according to claim 1, wherein the reference point mark has the concave shape with a depth or the convex shape with a height, which is greater than 30 nm.

6. The multilayer reflective film coated substrate for the reflective mask according to claim 1, comprising a mark-formation thin film between the substrate and the multilayer reflective film, wherein the reference point mark has the concave shape formed in the mark-formation thin film or the concave shape formed through the mark-formation thin film into the substrate.

7. The multilayer reflective film coated substrate for the reflective mask according to claim 6, wherein the mark-formation thin film is formed of a material having a resistance against an etching gas for etching the substrate.

8. The multilayer reflective film coated substrate for the reflective mask according to claim 1, wherein the reference point mark has the convex shape and is formed of a material different from a material forming the substrate.

9. The multilayer reflective film coated substrate for the reflective mask according to claim 1, wherein the reference point mark is formed at a position located inside by a predetermined width from an outer edge of the substrate.

10. The multilayer reflective film coated substrate for the reflective mask according to claim 1, wherein the reference point mark has a cross shape as seen from a main surface side of the substrate.

11. The multilayer reflective film coated substrate for the reflective mask according to claim 1, wherein the number of reference point marks is three or more and the three or more reference point marks are formed at positions that are not aligned in a straight line.

12. A reflective mask blank, comprising an absorber film for absorbing exposure light on the multilayer reflective film of the multilayer reflective film coated substrate for the reflective mask according to claim 1.

13. The reflective mask blank according to claim 12, comprising a buffer film composed mainly of Cr between the multilayer reflective film and the absorber film.

14. The reflective mask blank according to claim 12, comprising a capping film composed mainly of Ru between the multilayer reflective film and the absorber film.

15. A method of manufacturing a reflective mask, comprising a step of patterning the absorber film of the reflective mask blank according to claim 12 into a predetermined shape.

16. A method of manufacturing a multilayer reflective film coated substrate for a reflective mask, the multilayer reflective film coated substrate comprising a substrate and, on a main surface of the substrate, a multilayer reflective film having a structure in which high refractive index layers composed mainly of a high refractive index material and low refractive index layers composed mainly of a low refractive index material are alternately laminated, the method comprising the steps of forming a resist pattern having a reference point mark pattern on the main surface of the substrate, and dry-etching the substrate using the resist pattern as a mask, thereby forming a reference point mark having a concave or convex shape with a side wall being substantially upright.

17. A method of manufacturing a multilayer reflective film coated substrate for a reflective mask, the multilayer reflective film coated substrate comprising a substrate and, on a main surface of the substrate, a multilayer reflective film having a structure in which high refractive index layers composed mainly of a high refractive index material and low refractive index layers composed mainly of a low refractive index material are alternately laminated, the method comprising the steps of forming a mark-formation thin film on the main surface of the substrate, forming a resist pattern having a reference point mark pattern on an upper surface of the mark-formation thin film, and dry-etching the mark-formation thin film using the resist pattern as a mask, thereby forming a reference point mark having a concave or convex shape with a side wall being substantially upright.

18. A method of manufacturing a multilayer reflective film coated substrate for a reflective mask, the multilayer reflective film coated substrate comprising a substrate and, on a main surface of the substrate, a multilayer reflective film having a structure in which high refractive index layers composed mainly of a high refractive index material and low refractive index layers composed mainly of a low refractive index material are alternately laminated, the method comprising the steps of forming, on the main surface of the substrate, a mark-formation thin film having a resistance against an etching gas for etching the substrate, forming a resist pattern having a reference point mark pattern on an upper surface of the mark-formation thin film, dry-etching the mark-formation thin film using the resist pattern as a mask, thereby forming an etching mask pattern, and dry-etching the substrate using the etching mask pattern as a mask, thereby forming a reference point mark having a concave or convex shape with a side wall being substantially upright.

19. The method of manufacturing the multilayer reflective film coated substrate for the reflective mask according to claim 18, comprising the step of stripping the mark-formation thin film after forming the reference point mark on the substrate.

20. The method of manufacturing the multilayer reflective film coated substrate for the reflective mask according to any one of claims 16 to 18, wherein, upon forming the multilayer reflective film, the multilayer reflective film is formed on the main surface except at least a portion where the reference point mark is formed.

21. The method of manufacturing the multilayer reflective film coated substrate for the reflective mask according to claim 17 or 18, wherein the mark-formation thin film is formed of a material composed mainly of Cr.

22. A method of manufacturing a reflective mask blank, comprising a step of forming an absorber film for absorbing exposure light on the multilayer reflective film of the multilayer reflective film coated substrate for the reflective mask manufactured by the method of manufacturing the multilayer reflective film coated substrate for the reflective mask according to any one of claims 16 to 18.

23. The method of manufacturing the reflective mask blank according to claim 22, comprising a step of forming a buffer film composed mainly of Cr on the multilayer reflective film before forming the absorber film.

24. The method of manufacturing the reflective mask blank according to claim 22, comprising a step of forming a capping film composed mainly of Ru on the multilayer reflective film before forming the absorber film.

* * * * *